United States Patent [19]

Solie

[11] Patent Number: 4,556,949

[45] Date of Patent: Dec. 3, 1985

[54] THREE WAVE SURFACE ACOUSTIC WAVE (SAW) SIGNAL PROCESSOR

[75] Inventor: Leland P. Solie, Acton, Mass.

[73] Assignee: Sperry Corporation, New York, N.Y.

[21] Appl. No.: 481,710

[22] Filed: Apr. 4, 1983

[51] Int. Cl.[4] .......................... G06G 7/19; H03H 9/26

[52] U.S. Cl. .................................... 364/821; 364/841; 310/313 R; 333/195

[58] Field of Search ............... 364/800, 807, 819, 821, 364/604, 606, 841; 310/313 R, 313 A, 313 B, 313 C, 313 D; 333/150, 153, 193, 195

[56] References Cited

U.S. PATENT DOCUMENTS

| | | | |
|---|---|---|---|
| 3,833,867 | 9/1974 | Solie | 333/30 R |
| 3,947,783 | 3/1976 | Maerfeld | 333/153 |
| 4,016,513 | 4/1977 | Solie | 333/30 R |
| 4,041,419 | 8/1977 | Desormiére et al. | 333/193 |
| 4,055,758 | 10/1977 | Stern et al. | 310/313 R X |
| 4,075,706 | 2/1978 | Stern et al. | 364/821 |
| 4,079,342 | 3/1978 | Solie | 333/195 |
| 4,101,965 | 7/1978 | Ingebrigtsen et al. | 364/821 |
| 4,114,116 | 9/1978 | Reeder | 364/821 X |
| 4,193,045 | 3/1980 | Houkawa et al. | 310/313 B X |
| 4,224,683 | 9/1980 | Adkins | 364/821 |
| 4,480,237 | 10/1984 | Yamada | 310/313 R X |

*Primary Examiner*—Jerry Smith
*Assistant Examiner*—Gary V. Harkcom
*Attorney, Agent, or Firm*—Howard P. Terry; Seymour Levine

[57] ABSTRACT

A surface acoustic wave processor capable of performing convolution, correlation, time expansion/compression, and time reversal utilizes the nonlinear interaction between two input surface waves to generate a third surface wave. Phase matching for the third surface wave to perform an integration function is provided by a fan multistrip coupler (FMSC) which appropriately alters the velocity of an electric field pattern transferred from one track of the FMSC to a second track thereof.

6 Claims, 7 Drawing Figures

THREE WAVE SURFACE ACOUSTIC WAVE (SAW) SIGNAL PROCESSOR

BACKGROUND OF THE INVENTION

1. Field of the Invention

The invention relates to acoustic surface wave processors and more particularly to an apparatus for performing convolution, correlation, time compression, time expansion, and time reversal.

2. Description of the Prior Art

Surface acoustic waves (SAW) have been employed for a multiplicity of signal processing applications, particularly as a wave convolver, such as that disclosed in Applicant's U.S. Pat. No. 3,833,867 entitled "Acoustic Surface Wave Convolver With Bidirectional Amplification" and in U.S. Pat. No. 4,016,513 both of which are assigned to the assignee of the present invention. These processors are essentially three port devices, two SAW input ports and an electrical output port. In these devices electrical signals, the convolution of which is desired, are coupled to transducers that launch surface acoustic waves towards an interaction region from either end thereof. At each point along the propagation path in the interaction region the product of the two counter propagating waves is taken due to a nonlinear interaction between the waves. This nonlinear interaction may be caused by the nonlinearity in the stiffness matrix that relates the stress and the strain in a surface wave material. Another cause is the electrical nonlinearity between piezoelectric fields produced by the counter traveling surface waves and the charge carriers in a semiconductor. The latter requires a piezoelectric media and a semiconducting media in close proximity to allow the electric fields produced in the piezoelectric media to extend into and interact within the semiconducting media. This is possible if the two media are the same, as for example, in CdS which is both semiconducting and piezoelectric, or if a film of piezoelectric material is deposited on a semiconductor material, or if the piezoelectric material and the semiconductor material, are pressed together but are separated by a very narrow air gap. A metal electrode positioned over the interaction region detects the product of the two signals at each point and takes a summation thereof, thus producing an electrical signal representative of the convolution integral for the two signal inputs. This output signal is not a propagating wave, it is a spatial average of an electrical signal which exists at the surface of the crystal.

In another device the two counter propagating signals are at different frequencies and the convolution signal is detected in the interaction region by an interdigital structure having a periodicity given by $k_3=2\pi/D$, where D is the distance between adjacent electrodes having the same polarity, $k_3=k_2-k_1$ and $w_3=w_1+w_2$. $(w_1, k_1)$ and $(w_2, k_2)$ are the frequencies and wave numbers of the two propagating waves launched from the oppositely positioned input transducers. The product signal is periodic and thus detected by a periodic interdigital transducer over the interaction region but is not a propagating surface wave. If $w_1=w_2$ the convolver is degenerate and the detecting electrode structure is a solid metal electrode over the entire interaction region.

Convolvers and correlators of the prior art possess two input ports from which surface acoustic waves are launched and an electrical output port coupled to the interaction region of the two counter propagating waves. The present invention provides a device with four ports which may serve as input or output ports, three of which are utilized for any performable operation. An embodiment of the invention may be used for correlation, convolution, time expansion, time compression, and time reversal, with the signal resulting from the performed operation propagating as an surface acoustic wave from the interaction region to an output transducer for conversion to an electrical output signal.

SUMMARY OF THE INVENTION

The apparatus of the present invention may include a substrate with a nonlinear interaction region wherein counter traveling surface waves are combined to produce signals representative of the products thereof. A first array of substantially parallel electrically conducting strips are positioned in the interaction region with spacing $d_1$ therebetween. Acoustic signals having different frequencies, $w_1$ and $w_2$, and propagating in a direction that is substantially perpendicular to the array of parallel strips, are incident to the first array from acoustic ports disposed at opposite ends thereof. Due to the nonlinearities in the interactive region, electrical signals representative of the products of the counter propagating waves are induced on the electrical conductive elements of the first array and correspondingly coupled to electrically conductive elements in a second array disposed in the interaction region adjacent to the first array with a periodicity $d_2$ that differs from $d_1$. The spacings $d_2$ are greater than $d_1$ or less than $d_1$ in accordance with the selection of the difference frequency component of the product or the sum frequency component of the product respectively. In either situation the strip periodicity is chosen to match the surface wave phase velocity of the selected component of the product signal so that the electrical signals at each conductive strip of the second array support this surface wave in the interactive region. The electrically supported surface wave propagates along the substrate in the direction substantially perpendicular to the conductive strip elements of the second array to a third port.

DESCRIPTION OF THE PREFERRED EMBODIMENTS

Figure 1:
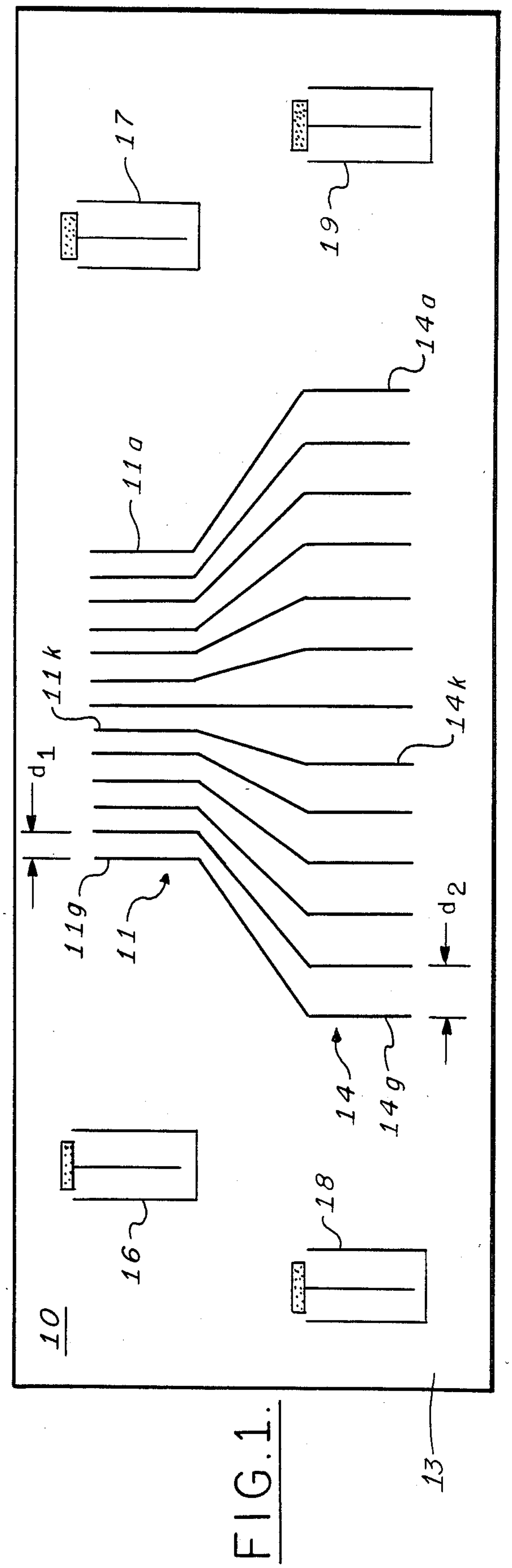
FIG. 1 is a schematic representation of a preferred embodiment of the invention.

Referring to FIG. 1 a signal processor 10, in accordance with the present invention, may include a first array 11 of parallel electrically conducting strips 11*a* through 11*q* on a substrate 13 having a periodicity $d_1$ and a second array 14 of parallel electrically conducting strips 14*a* through 14*q* on substrate 13 having a periodicity $d_2$. The array 11 lies on an acoustic track between surface wave ports 16 and 17 while the array 14 lies on an acoustic track between surface wave ports 18 and 19. The acoustic ports 16, 17, 18, 19 may be electrical signal-acoustic wave transducers well known in the art. Though four acoustic ports, represented by the transducers 16, 17, 18, 19 are shown, as will subsequently become evident, only three are used in any one processing operation.

CORRELATION

Figure 2:
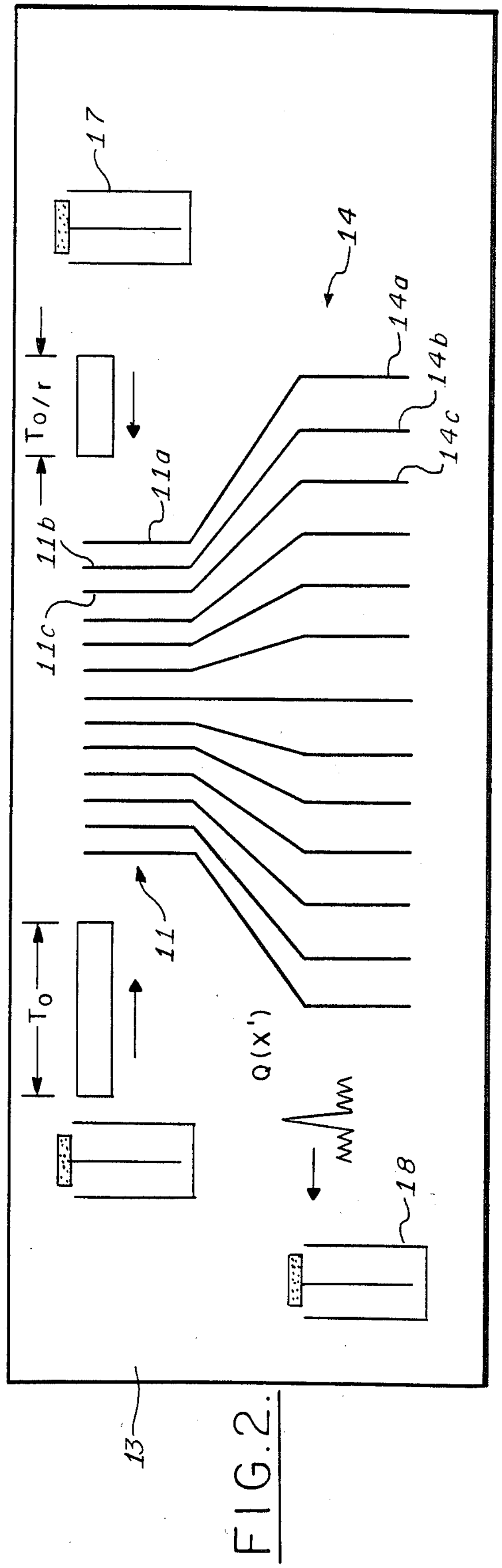
FIG. 2 is an embodiment of the invention with incident signal durations indicated thereon, that is useful in explaining the invention in its correlation mode.

Assume an input signal S (x, t) of duration $T_0$ incident to the first array 11 from the acoustic input port 16 and a reference signal R (x, t) of duration $T_0/r$ incident to the first array 11 from the acoustic input port 17, as shown in FIG. 2, each respectively of the form $$S(x,t)=S_0(w_{M1}t-k_{M1}x)\exp j(w_{C1}t-k_{C1}x)$$

$$R(x,t)=R_0(w_{M2}t+k_{M2}x)\exp j(w_{C2}t+k_{C2}x) \quad (1)$$

Array 11 forms the interaction region wherein, due to the nonlinear interaction between the two counter propagating waves, the product P (x, t)=S (x, t) R (x, t) is formed. The carrier and modulation signals comprising the input and reference signals are waves that propagate along the surface of the substrate at an acoustic velocity v for which $$w_{M1}/k_{M1}=w_{M2}/k_{M2}=w_{C1}/k_{C1}=w_{C2}/k_{C2}=v \quad (2)$$

Further, it will be convenient to define $w_{M2}/w_{M1}=r_M$ and $w_{C2}/w_{C1}=r_C$.

Electrical coupling of signals from array 11 to array 14 and the expansion factor $A=d_2/d_1$ between the arrays cause an increase in the phase velocity in the region of array 14. This increase in velocity may be represented as a scale factor increase along the array 14 with the distance therealong x'' represented as $$x''=Ax \quad (3)$$

Since the product signal P (x, t) is transferred from array 11 to the array 14 the product signal P'' (x'', t) along the array 14 is $$P''(x'',t)=P(x,t) \quad (3a)$$

The product signal P'' propagates within the array 14 from each x'' at an acoustic velocity v and may be represented in a coordinate system x' within the array 14 defined by $$x'=x''+vt=Ax+vt \quad (4)$$

establishing a product P' in the primed system that is given by $$P'(x',t)=P(x,t)=P\left(\frac{x'-vt}{A},t\right) \quad (5)$$

As will be explained subsequently the time average of P' (x', t) is formed in the systems so that the wave Q (x') incident to the output terminal 18 is given by:

$$Q(x')=\int P\left(\frac{x'-vt}{A},t\right)dt \quad (6)$$

When the product of two co-linear propagating waves at frequencies $w_1$ and $w_2$ with wave vectors $\vec{k_1}$ and $\vec{k_2}$ is taken it is well known that two waves at frequencies $w_1 \pm w_2$ with wave vectors $\vec{K_3}=\vec{K_1}-\vec{K_2}$ having magnitudes $K_3=K_1\pm K_2$ are formed. Consider the wave formed at the carrier difference frequency $w_{C3}=w_{C2}-w_{C1}$ so that $$P\left(\frac{x'-vt}{A},t\right)=R_O\left[w_{M2}t+k_{M2}\frac{(x'-vt)}{A}\right]\cdot S_O\left[w_{M1}t-k_{M1}\frac{(x'-vt)}{A}\right]\exp j\left[(w_{C2}-w_{C1})t+(k_{C2}+k_{C1})\frac{(x'-vt)}{A}\right] \quad (7)$$

If the two signals forming the product are cw signals without modulation (e.g. $S_0=R_0=1$) the product signals formed are also cw signals. Since v/A is a phase velocity, the points of constant phase along the propagation path are independent of time. This requires that $$\frac{v}{A}=\frac{w_{C2}-w_{C1}}{k_{C2}+k_{C1}}=v\frac{r_C-1}{r_C+1} \quad (8)$$

$$A=\frac{r_C+1}{r_C-1}$$

It should be recognized that $r_M$ may take on any value greater than one. Consider, however, $r=r_C=r_M$ with the following variable substitutions $$\theta=w_{M1}\frac{(A+1)}{A}t+r\frac{k_{M1}x'}{A} \quad (9)$$

$$\phi=\theta-\frac{k_{M1}(x+1)x'}{A}=\theta-k_{M1}(r-1)x'$$

Thus it is evident that the output wave Q (x') is the correlation of the modulation wave forms of the signals incident to the first array 11 from input terminals 16, 17.

Figure 3A:
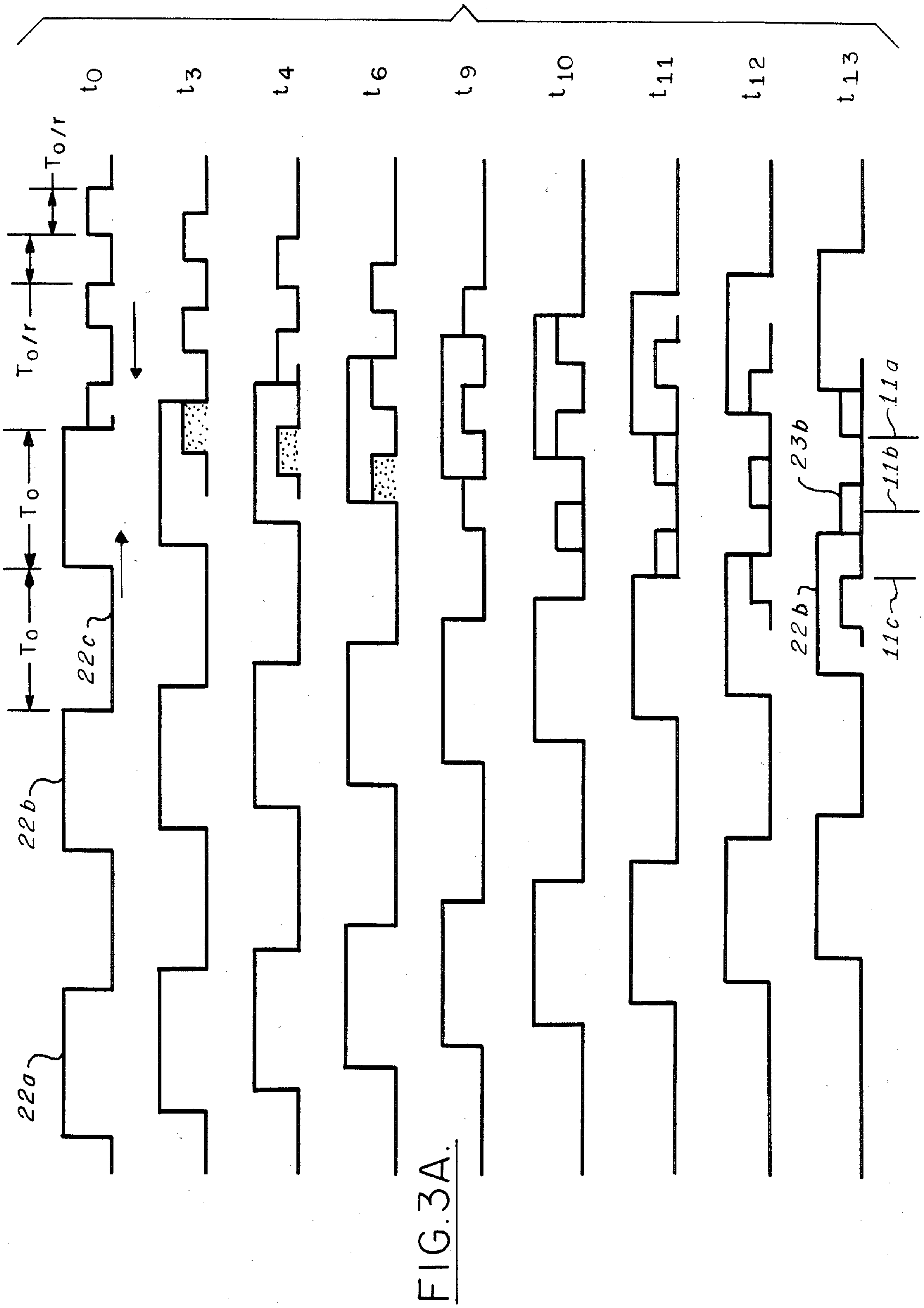
FIGS. 3A and 3B is a time sequence of signal position in the interactive region of the invention showing thereon regions of signal overlap where within correlation is performed. This sequence is useful for explaining the relative phase velocities of the propagating waves through the interaction region of the invention.

As previously stated the FMSC 10 generates the product of the two input propagating surface waves and couples a propagating surface wave Q (x') to an output terminal 18 that is representative of a time average of the product signals so formed. How the required summation is realized may be explained with references to FIGS. 2 and 3. Assume the signal $S_0$ is a pseudo-random code of which pulses 22*a*, 22*b*, and 22*c* shown in FIG. 3A are part thereof and that reference signal $R_0$ is an identical code compressed in time by a factor r. Correlation of the signal and reference commences when the two sequences initially meet. Assume this to be at electrode 11*a* at a time $t_0$. At this time a product of the signals is initiated which reaches a peak at time $t_3$. As the two signals propagate in opposite directions along the surface of the substrate the product is formed at different locations in the coordinate system of the electrode array moving from the electrode 11$a$ to the electrode 11$b$ in the time sequence from $t_0$ to $t_6$. Though not shown in the figure, it should be recognized that additional electrodes are located at the periodicity of the array between the electrodes 11$a$ and 11$b$. For each multiplication an electrical signal, corresponding to the difference signal component of the product, is transfered from the electrodes in array 11 to the electrodes in the array 14. Each transfer induces a SAW that propagates with a velocity to establish a time of arrival at the adjacent electrode in array 14 that coincides with the transfer of an electrical signal thereto from the array 11. After the time $t_9$, a signal representative of the summation of the products formed in the time interval between $t_9$ and $t_0$ propagates from electrode 14$b$ towards the electrode 14$c$. When this integrated signal reaches electrode 14$c$ the second pulses in the signal and reference sequences are at electrode 11$c$ and the products thereformed are similarly transferred to the propagating wave in the array 14 and added to the previous summation in a like manner thereby continuing the integration of the product signals. This continues until the propagating signal and reference waves completely traverse the array 11, whereafter a correlation signal Q (x') representative of the summation of the products formed within the array 11 is coupled from the array 14 to the output port 18. Since it has been assumed that the signal and reference pulse sequences are pseudo-random codes the summation of the cross products, as for example, the products formed by the pulse 22$b$ with the pulse 22$c$, integrate to zero leaving only the products of the corresponding signal and reference pulses in the summation.

Figure 3B:
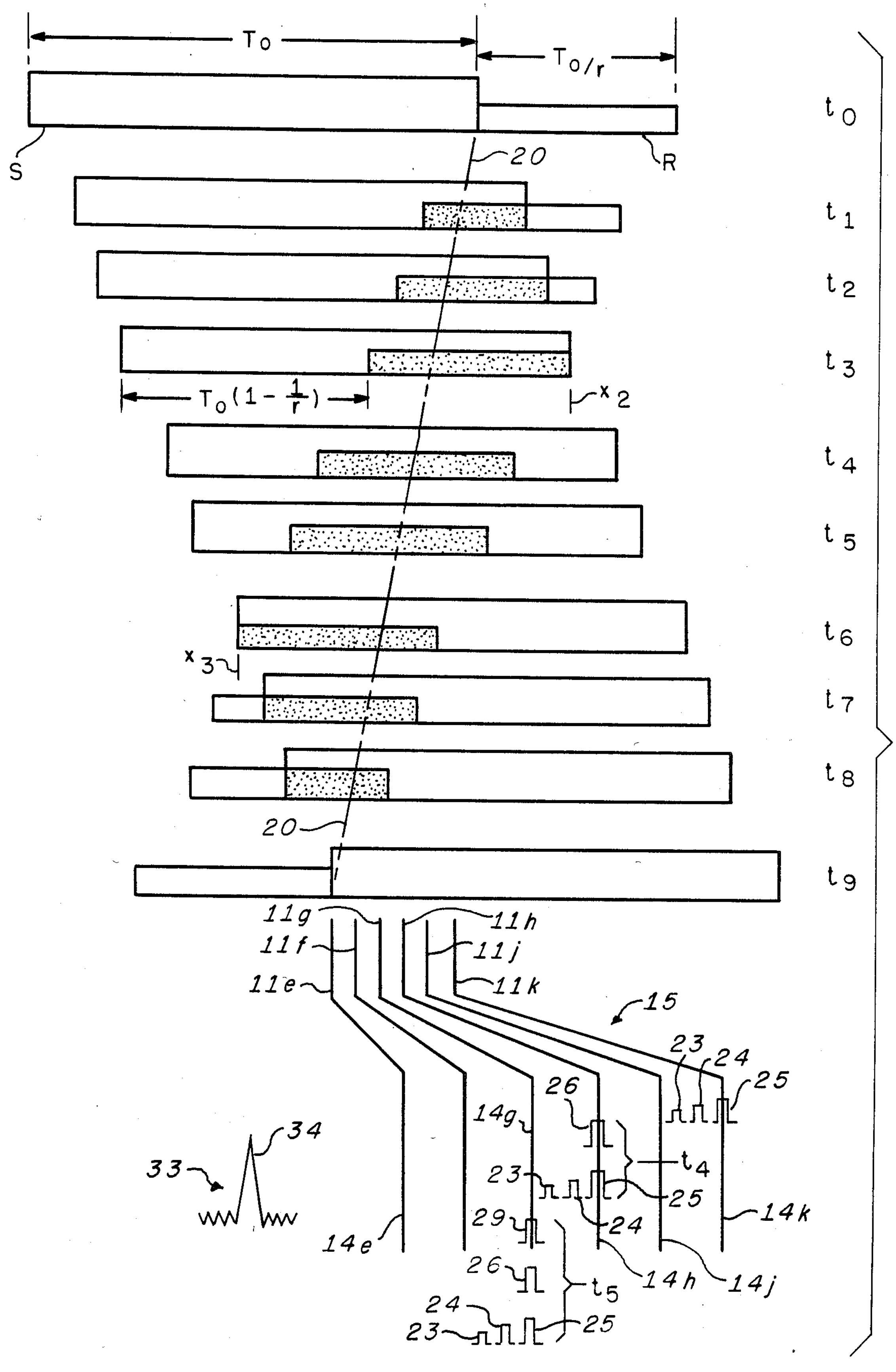

Refer now to FIG. 3B. Assume the leading edges of the signal pulse S and the reference R of respective lengths $T_0$ and $T_0/r$ meet at an electrode 11$k$ in the first array 11. S and R are identical coded signals except that R is compressed in time by the factor r. Therefore, $R_I$ equals $S_I$ for all values of I. The pulses S and R continue to propagate to the right and left respectively until at $t_1$ there is a partial overlapping of the pulses that is indicated by the shaded region on the line labeled $t_1$. The area of this shaded region is representative of the product of the two pulses and the crossing of the correlation peaked line 20 with the pulses is the point where the product formed is always positive, i.e., $S_I x R_I = S_I^2 = R_I^2 > 0$. Assume that this occurs at the electrode 11$k$. This product is then transferred from electrode 11$k$ to electrode 14$k$ in the second array 14 and commences to propagate therefrom as a surface wave along the substrate. As the two pulses continue to propagate past the electrode 11$k$ the overlapping region increases, as shown on line labeled $t_2$, with the position of the product moving to the left of the electrode 11$k$. At $t_3$ the overlapping region includes the entire reference pulse R while the correlation product is formed to the left of electrode 11$k$ as indicated by the cross of the correlation peak line 20 with the pulses. The continued counter propagation of the two pulses, after the reference pulse is completely within the signal pulse, causes the position of the product to move to the left in the first array 11 from the electrode 11$k$ to the left adjacent electrode 11$j$ and to the left adjacent electrode 11$b$ thereto, etc. These products are transferred from the track along the first array 11, via the coupling electrodes 15, to corresponding electrodes in the second array 14 and propagate to the left therefrom. In this manner the preceding product pulse which is propagating as a surface acoustic wave arrives at an electrode in the second array coincident with the product pulse transferred from the first array at that instant of time. For example, consider the product pulse 26 in the second array 14 at time $t_4$ that is transferred from the product formed at electrode 11$h$ in the first array 11. At the time this pulse is transferred to the second array the pulse train 23, 24, 25 has propagated from the electrode 14$k$ to a position along the array 14 whereat the pulses 25, 26 coincide. These pulses add and the train continues to propagate towards the electrode 14$g$. At the time $t_5$ the product formed at electrode 11$g$ in the array 11 is transferred to the array 14 to form a pulse 29 therein such that pulses 25, 26, 29 are in alignment at electrode 14$g$ and add. This integration continues until the leading edge of the reference pulse $R_I$ and the trailing edge of the signal pulse $S_I$ coincide. At this time the product is formed at the electrode 11$e$, whereat the products of the subsequent partial overlappings also occur, thus providing a wave 33 propagating from electrode 14$e$ that comprises a sharp main pulse 34 with significantly reduced side lobes on either side thereof. Those skilled in the art will recognize that the time interval between signal summations is a function of the electrode spacing, the summation approaching a continuous integration as the periodicity of the arrays increase.

The time interval $\Delta T = t_6 - t_3$ between the complete overlapping of the reference pulse $R_I$ in the signal pulse $S_I$, the interval during which peak product pulses propagate between electrodes 14$k$ and 14$e$, is $$\Delta T = \frac{T_O}{2}\left(1 - \frac{1}{r}\right) \tag{10}$$

Since v is the surface wave velocity the distance between the electrodes 11$k$ and 11$e$ may be determined is $$d_{KE} = v\Delta T = \frac{vT_O}{2}\left(1 - \frac{1}{r}\right) \tag{11}$$

It should be apparent that the time interval between $T_0$ and $T_9$, the elapsed time for the entire pulse correlation, is $$\Delta T = \frac{T_O}{2}\left(1 + \frac{1}{r}\right) \tag{12}$$

Thus the distances $L_1$ and $L_2$ between electrodes 11$k$ and 11$e$ and between electrodes 14$k$ and 14$e$, respectively, are in the order $$L_1 = \frac{vT_O}{2}\left(1 + \frac{1}{r}\right) = vT_O\frac{A}{A+1} \tag{13}$$

$$L_2 = AL_1 = \frac{vT_OA^2}{A+1}$$

From equations 11 and 12, the velocity V of the correlation function along the first array 11 is $$V = \frac{d_{KE}}{\Delta T} = v\frac{r-1}{r+1} = \frac{v}{A} \tag{14}$$

Since this velocity is increased by a factor A in FMSC the velocity of the entire correlation function along the second array 14 is equal to the surface wave velocity along the substrate.

TIME COMPRESSION OF THE CORRELATION SIGNAL

Referring again to FIG. 3B, the position $x_2$ at which the trailing edge of the reference pulse $R_I$ is coincident with the leading edge of the signal pulse $S_I$ and the position $x_3$ at which the leading edge of the reference pulse $R_I$ and the trailing edge of the signal pulse $S_I$ coincide may be represented in the moving coordinate system along the track in the second array 14 as $$x'_2 = Ax_2 + vt$$

$$x'_3 = Ax_3 + vt \qquad (15)$$

The difference between these positions in the primed coordinate system is the extent of the peak pulse of the propagating correlation function. Thus the time duration $T_D$ of the correlation pulse is given by $$T_D = \frac{x_{2'} - x_{3'}}{v} = \frac{AT_O}{2}\left(\frac{1+r}{r}\right) - \frac{T_O}{2}\left(\frac{1-r}{r}\right) \qquad (16)$$

$$T_D = T_O(A-1)$$

Since the auto-correlation of a gated CW pulse having width $T_0$ is a triangular pulse of basewidth $2T_0$, the ratio of the time duration $T_D$ of the correlation signal obtained with the invention methods to the time duration of a correlation signal obtained with conventional methods is given by:

$$\frac{T_D}{2T_O} = \frac{A-1}{2} \qquad (17)$$

Therefore, when $A=3$ the time duration $T_D$ is equal to the time duration $2T_0$ of a correlation signal obtained by a conventional correlation process.

GENERATION OF A REFERENCE SIGNAL

Figure 4:
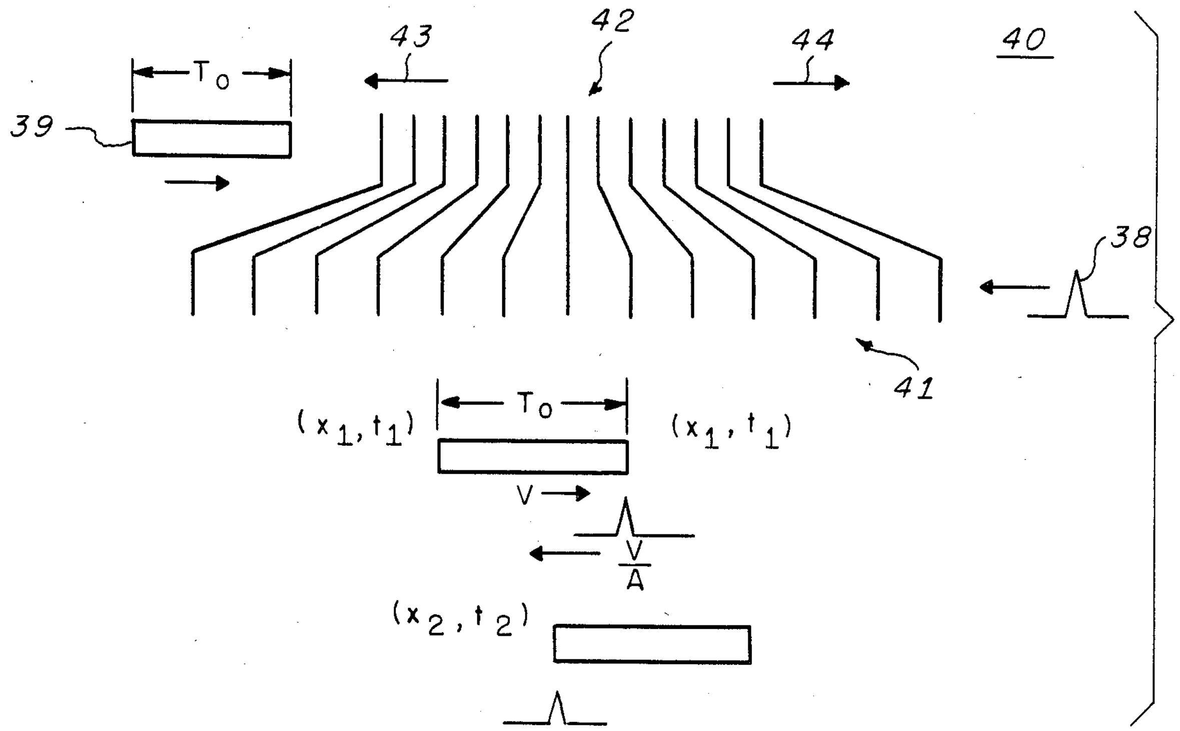
FIG. 4 is diagram of a signal and impulse interaction for generating a compressed signal.

To perform an auto-correlation, as above described, a time compressed replica of the signal at a frequency r times the frequency of the input signal is required. This reference signal may be generated by coupling an impulse 38 to the right input terminal of the second array (expanded array) 41 of a FMSC 40 and the signal 39 to be compressed to the left input terminal of the first array (nonexpanded array) 42 of the FMSC 40 as shown in FIG. 4. The impulse 38 moving in the second array 41 at a velocity v is transferred to the first array 42 to propagate therein at a velocity v/A and will initiate a product with the signal 39 at a time $t_1$ at a position along the substrate $x_1$. Products will be formed along the array 42 until $t_2$, the time at which the impulse coincides with the trailing edge of the signal 39 at a position $x_2$ along the array 42. The distance between $x_2$ and $x_1$ divided by the surface wave velocity is the duration of the product signal generated by the multiplication of the impulse 38 with the signal 39 along the array 42. This signal will propagate along the array 42 towards the port from which the signal 39 is incident when the wave vector $k_I$ of the impulse 38 is greater than the wave vector $k_S$ of the signal 39, as indicated by the arrow 43, and towards the port opposite thereto as indicated by the arrow 44, when the relative magnitudes of the wave vectors are reversed.

The positions $x_1$ and $x_2$ are fixed in a coordinate system of the substrate, but vary with time in the primed moving coordinate system, wherein they may be represented as:

$$x'_2 = x_2 + vt_2$$

$$x'_1 = x_1 + vt_1 \qquad (18)$$

Since the length of the signal $vt_0$ is equal to the sum of the distances traveled (v/A)t and vt of the impulse and signal respectively during the time interval $t_2 - t_1 = t$, the elapsed time between the coincidence of the impulse with the leading edge of the signal and the subsequent coincidence of the impulse with the trailing edge of the signal is $(AT_0/A+1)$.

Taking the difference between equations 18, substituting the elapsed time interval therein, and remembering that v/A is in the negative direction, yields a product duration $vT_0/r$. Thus the product wave is of a time duration $T_0/r$ and propagates in a direction dependent upon the relative magnitudes of the impulse and signal wave vectors. The center frequency of the impulse should be $w_1(r-1)$ when the sum signal component of the product is utilized and $w_1(r+1)$ when the difference signal component of the product is utilized to provide a compressed output signal at a frequency $rw_1$, where $w_1$ is the frequency of the signal 39.

TIME REVERSAL

Figure 5:
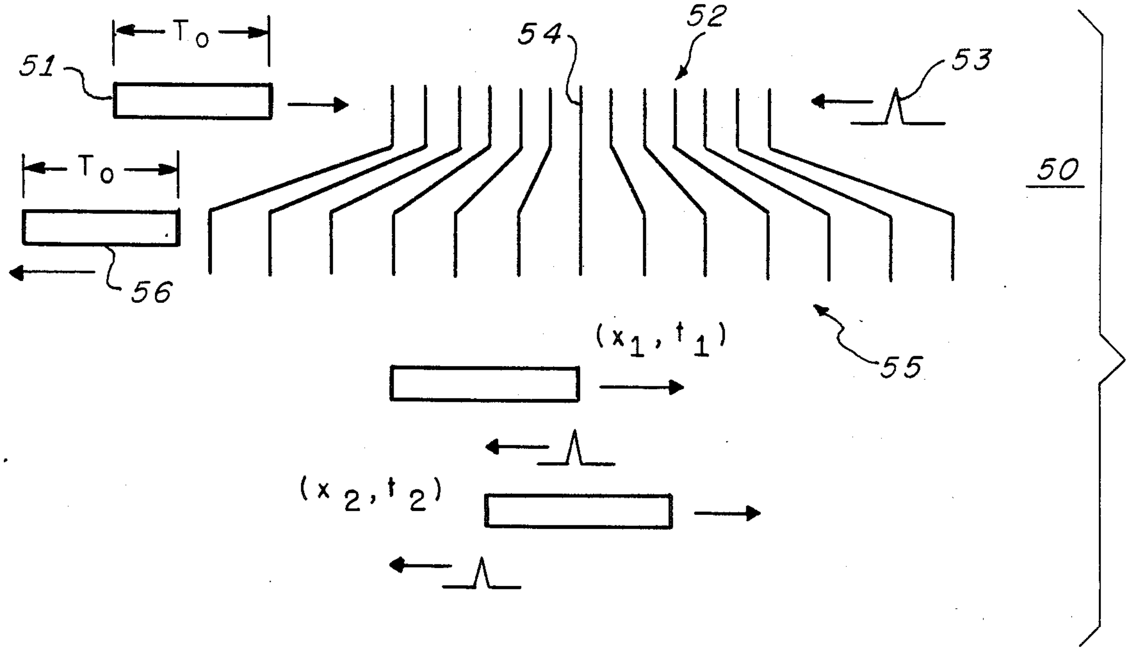
FIG. 5 is a diagram of signal and impulse interaction for generating a time reversed signal.

It is well known that correlation and convolution are similar processes, differing only by the folding, or time reversal of the displaced function prior to the formation of the product in the convolution process. Time reversal of a signal may be accomplished with the principles of the present invention by coupling the signal to be time reversed to one port and an impulse to the other port of the unexpanded array of a FMSC. Refer now to FIG. 5 wherein a signal 51 is shown incident to the left port of the unexpanded array 52 of a FMSC 50 and an impulse 53 is coupled to the right port thereof. Since the velocity of the signal 51 and the impulse 53 are equal along the unexpanded array 52 the leading edge of the signal 51 and the impulse are coincident at the center 54 of the array 52 at a time $t_1$. The product between the two is formed for a time interval $t_2 - t_1 = T_0/2$ establishing an interaction distance d that is $vT_0/2$. This product is transferred to the expanded array 55 and propagates as a surface acoustic wave therefrom as a time reversed signal 56 of duration $T_0$ when the wave vector magnitude of the impulse 53 exceeds that of the signal 51.

As previously discussed, the product wave propagates along the array 52 with velocity v and along the array 55 at a velocity Av. The leading edge $x_1$ and the trailing edge $x_2$ of the product pulse are transformed to the prime coordinate system of the expanded array 55 in accordance with the transformation:

$$x'_2 = Ax_2 + vt_2$$

$$X'_1 = Ax_1 + vt_1 \qquad (19)$$

where $x_{2'} - x_{1'} = -L$. Since $x_2 - x_1$ is a negative quantity, the difference between equations 19 yields:

$$L = \frac{vT_O}{2}(A-1) \quad (20)$$

Thus the output signal is time reversed (propagating in a direction opposite to that of the input signal) and scaled by a factor $(A-1)/2$. When $A=3$ this scale factor is unity, preserving the signal length, and a simple time reversed signal propagates from the expanded array 55.

The above has assumed a perfect impulse function. Generally, however, the impulse employed is a gated signal. For this situation the frequency of the gated signal should be $w_2=rw_1$, where $w_1$ is the frequency of the gated signal 51 and $$r = \frac{A+1}{A-1}.$$

Figure 6:
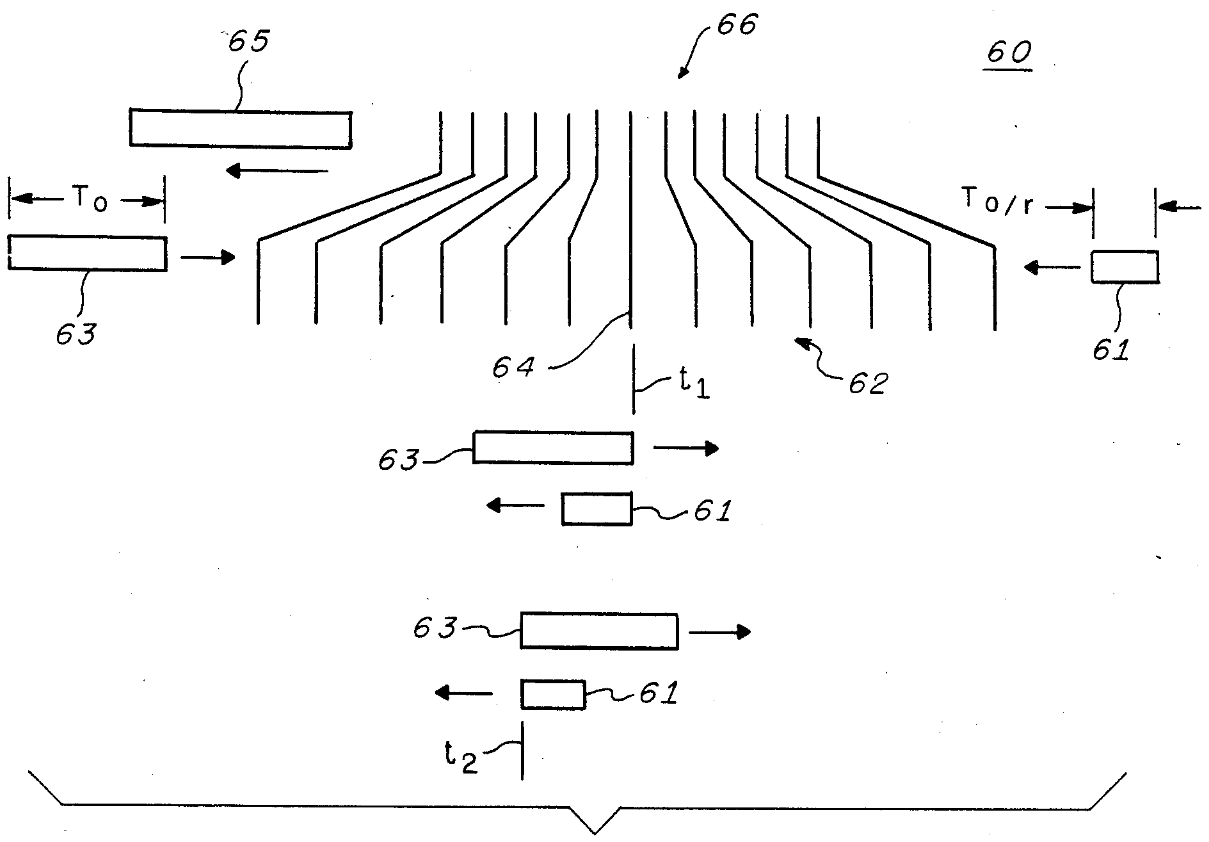
FIG. 6 is a diagram of signal and reference signal interaction within the interaction region of the invention during the convolution mode of operation.

Refer now to FIG. 6 wherein a compressed reversed signal 61 is incident to the right port of the expanded array at 62 of a FMSC 60 and the signal 63 to be convolved with the reference signal 61 is incident to the left port thereof. In the expanded track signal 61, 63 propagate at the same velocity causing the initial products to be formed near the center 64 of the FMSC 60, the product continuing to be formed near the center until the reference pulse 61 is completely within the signals 63. The trailing edge of a product signal 65, transferred from the expanded array 62 to propagate along the unexpanded array 66, is formed, at a time $t_1$, when the leading edge of the signal 63 coincides with the trailing edge of the reference signal 61. After this coincidence, reference signal 61 and signal 63 continue to counter propagate until the leading edge of reference signal 61 is coincidence with the trailing edge of signal 63, at a time $t_2$, forming the leading edge of the output signal 65. In the time interval $(t_2-t_1)$ between the edge coincidences, reference signals 61 and signal 63 traverse a distance $d_1$ given by:

$$d_1 = \frac{vT_O}{2}\left(1 - \frac{1}{r}\right) \quad (21)$$

while the distance $d_2$ between the leading and trailing edges coincidences established during this interval is given by:

$$d_2 = \frac{vT_O}{2}\left(1 + \frac{1}{r}\right) \quad (22)$$

Since the time interval $t_2-t_1=d_1/v$, it should be apparent that the product signal velocity V is:

$$V = \frac{d_2}{t_2 - t_1} = v\frac{r+1}{r-1} = Av \quad (23)$$

As previously described, FMSC 60 reduces the product signal velocity V in the expanded array 62 by a factor of A in the unexpanded array 66 so that the output signal edges, terms of constant T in S(t) R(T−t), phase match and are integrated in the unexpanded array 66. To produce this phase match the following conditions must hold:

$$w_3 = w_2 + w_1 \quad (24)$$

$$k_3 = k_2 - k_1$$

$$v_3 = \frac{w_2 + w_1}{k_2 - k_1} = v\frac{r+1}{r-1} = Av$$

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. A surface wave apparatus comprising:

means having a surface layer for propagating acoustic waves, said surface layer having an interaction region possessing nonlinear properties such that two acoustic signals coalescing in said interaction region form a product signal representative of a multiplication of said two signals;

a first array of conductive elements having first and second acoustic ports, said conductive elements positioned in said interaction region with spacing $d_1$ therebetween;

a second array of conductive elements having third and fourth acoustic ports located such that said first and third ports and said second and fourth ports respectively form port pairs at opposite ends of said first and second arrays, said conductive elements of said second array correspondingly coupled to said conductive elements of said first array and positioned in said interaction region with spacing $d_2$ between said conductive elements of said second array, where $d_2=Ad_1$, A being a predetermined constant, said spacing $d_2$ selected for propagating said product signal along a selected array.

2. A surface acoustic wave apparatus in accordance with claim 1 wherein said product signal propagates to said third port and results when a first signal at a frequency $w_1$ and duration $T_0$ is coupled to said first acoustic port and a second signal at frequency $w_2=rw_1$ at a duration $T_0/r$ is coupled to said second acoustic port, r being a factor greater than one and A being related to r by $A=(r+1)/(r-1)$.

3. A surface acoustic wave processor in accordance with claim 1 wherein said product signal propagates to said third port and results when a signal at a frequency $w_1$ and duration $T_0$ is coupled to said first acoustic port and an impulse at a frequency $w_2=rw_1$ is coupled to said second acoustic port, r being a factor greather than one and A being related to r by $A=(r+1)/(r-1)$.

4. A surface acoustic wave apparatus in accordance with claim 1 wherein said product signal results when a signal at a frequency $w_1$ and duration $T_0$ is coupled to said first port and an impulse signal at a frequency of $w_1(r-1)$, r being a factor greater than one, is coupled to said fourth port, A being related to r by $A=(r+1)/(r-1)$ said product signal propagating to said first port where $r-1$ is greater than one, and to said second port when $r-1$ is less than one.

5. A surface acoustic wave apparatus in accordance with claim 1 wherein said product signal propagates to said first port and results when a first signal at a frequency $w_1$ and time duration $T_0$ is coupled to said third port and a second signal at a frequency $w_2=rw_1$ and a time duration $T_0/r$ is coupled to said fourth port, r being a factor greater than unity, with A related to r by $A=(r+1)/(r-1)$.

6. A surface acoustic wave apparatus in accordance with claim 1 wherein said product signal propagates to said first port and results when a signal at a frequency $w_1$ and duration $T_0$ is coupled to said first port and an impulse signal at a frequency of $w_1(r+1)$, r being a factor greater than one, is coupled to said fourth port, A being related to r by $A=(r+1)/(r-1)$.

* * * * *